United States Patent
Wakabayashi et al.

(10) Patent No.: US 9,939,632 B2
(45) Date of Patent: Apr. 10, 2018

(54) DIGITAL MIRROR DEVICE, METHOD OF MANUFACTURING DIGITAL MIRROR DEVICE, AND IMAGE DISPLAY APPARATUS

(71) Applicant: SEIKO EPSON CORPORATION, Tokyo (JP)

(72) Inventors: Junichi Wakabayashi, Matsumoto (JP); Takunori Iki, Azumino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 84 days.

(21) Appl. No.: 14/995,517

(22) Filed: Jan. 14, 2016

(65) Prior Publication Data

US 2016/0216509 A1  Jul. 28, 2016

(30) Foreign Application Priority Data

Jan. 28, 2015 (JP) ................ 2015-014087

(51) Int. Cl.
  *G02B 26/08* (2006.01)
  *B81B 3/00* (2006.01)

(52) U.S. Cl.
  CPC ............ *G02B 26/0841* (2013.01); *B81B 3/00* (2013.01)

(58) Field of Classification Search
  CPC .. G02B 26/0833; G02B 26/0841; B81B 3/00; B81B 3/0048; B81B 3/0051; B81B 3/0078
  USPC ......... 359/199.2, 213.1, 220.1, 223.1, 224.1, 359/225.1, 295, 298, 318, 849, 855, 900; 353/99
  See application file for complete search history.

(56) References Cited

U.S. PATENT DOCUMENTS

| | | | | |
|---|---|---|---|---|
| 5,631,782 A | * | 5/1997 | Smith | G02B 26/0841 359/214.1 |
| 5,650,881 A | * | 7/1997 | Hornbeck | B81B 3/0072 348/771 |
| 6,108,121 A | * | 8/2000 | Mansell | G02B 26/0841 359/224.1 |
| 6,136,390 A | * | 10/2000 | Park | G02B 26/0858 216/13 |
| 7,031,082 B2 | * | 4/2006 | Murasato | G02B 27/0068 359/291 |
| 7,567,367 B2 | * | 7/2009 | Ji | B81B 3/007 359/198.1 |
| 9,696,539 B2 | * | 7/2017 | Tamamori | G02B 26/0825 |

(Continued)

FOREIGN PATENT DOCUMENTS

| | | |
|---|---|---|
| JP | 2000-147419 A | 5/2000 |
| JP | 2006-309152 A | 11/2006 |
| JP | 2008-020505 A | 1/2008 |

*Primary Examiner* — Frank Font
(74) *Attorney, Agent, or Firm* — Oliff PLC

(57) ABSTRACT

A substrate, a plurality of mirrors disposed on one surface of the substrate to be separated from the substrate, a mirror support post disposed between the substrate and the mirror and connected to a part of the mirror to support the mirror, a first electrode disposed between a first portion of the mirror and the substrate on the substrate, a second electrode disposed between the substrate and a second portion facing the first portion are included. The mirror includes a thin portion in which a thickness of at least a part of an end portion of a rear surface of the mirror is thinner than a thickness of a middle of the mirror.

20 Claims, 13 Drawing Sheets

(56) References Cited

U.S. PATENT DOCUMENTS

| | | | | |
|---|---|---|---|---|
| 2001/0053016 A1* | 12/2001 | Nelson | .................. | B81B 3/0051 |
| | | | | 359/291 |
| 2002/0114053 A1* | 8/2002 | Yasuda | ................. | B81B 3/0051 |
| | | | | 359/224.1 |
| 2005/0185239 A1* | 8/2005 | Orcutt | .................... | B81B 3/007 |
| | | | | 359/199.1 |
| 2005/0225821 A1* | 10/2005 | Orcutt | .................... | B81B 3/007 |
| | | | | 359/224.1 |
| 2006/0219879 A1 | 10/2006 | Katou et al. | | |
| 2007/0053052 A1* | 3/2007 | Pan | ....................... | B81B 3/0005 |
| | | | | 359/291 |
| 2007/0053086 A1* | 3/2007 | Orcutt | .................. | B81B 3/0067 |
| | | | | 359/872 |
| 2007/0146857 A1* | 6/2007 | Orcutt | .................. | G02B 7/1821 |
| | | | | 359/224.1 |
| 2007/0171508 A1* | 7/2007 | Huibers | ............. | G02B 26/0841 |
| | | | | 359/291 |
| 2011/0149362 A1* | 6/2011 | Moidu | ............... | G02B 26/0841 |
| | | | | 359/226.1 |
| 2015/0103391 A1* | 4/2015 | Sherwin | ............. | G02B 26/0833 |
| | | | | 359/291 |
| 2015/0153566 A1* | 6/2015 | Armbruster | ........ | G02B 26/0841 |
| | | | | 359/224.1 |

\* cited by examiner

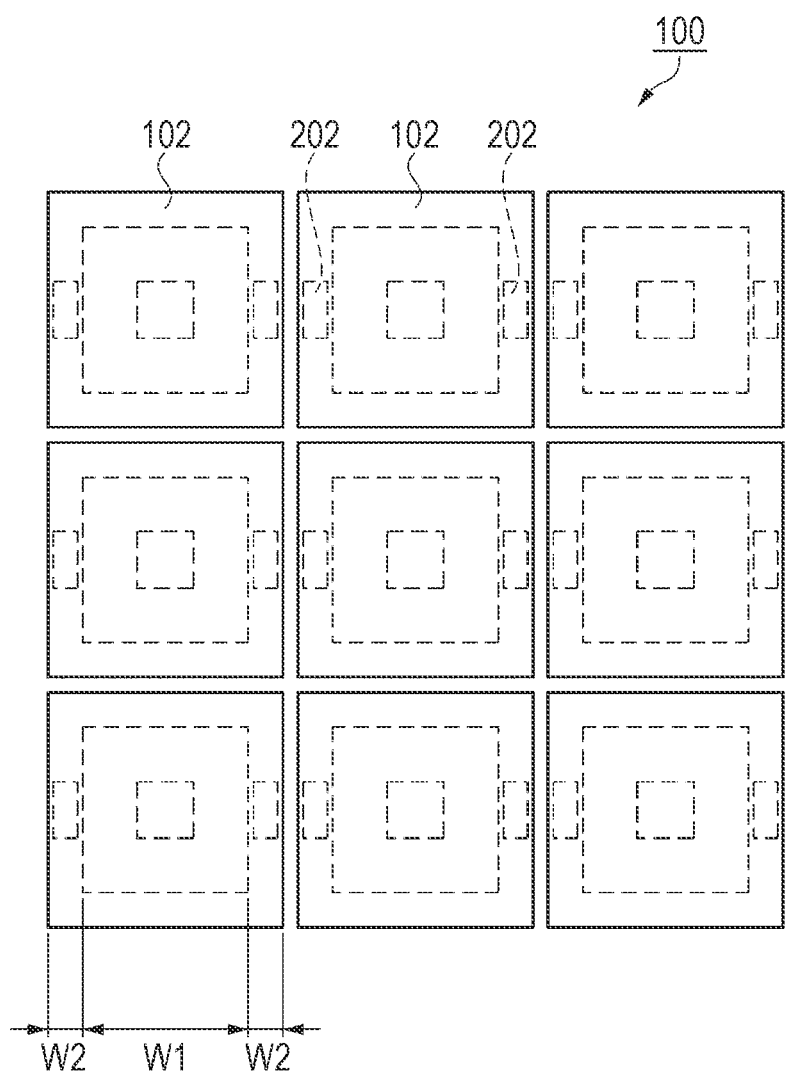

DIGITAL MIRROR DEVICE, METHOD OF MANUFACTURING DIGITAL MIRROR DEVICE, AND IMAGE DISPLAY APPARATUS

CROSS-REFERENCE TO RELATED APPLICATION

This application claims priority to Japan Patent Application No. 2015-014087 filed Jan. 28, 2015, the entire disclosures of which are hereby incorporated by reference in their entireties.

BACKGROUND

1. Technical Field

The present invention relates to a digital mirror device, a method of manufacturing the digital mirror device, and an image display apparatus.

2. Related Art

As image display apparatuses, there are known projectors that display colors on screens, for example, by concentrating light emitted from light sources to digital mirror device called digital micro mirror device (DMD) and causing projection optical systems to expand and project the light.

As a digital mirror device, for example, JP-A-2000-147419 discloses a light deflector that includes a base and a reflection mirror unit disposed in the base to be swayable via a pair of electrodes. Such a light deflector displays an image in such a manner that the reflection mirror unit is pivoted by applying a voltage between the electrodes and the reflection mirror unit.

As illustrated in FIG. 15, in a digital mirror device 500, a plurality of micro mirrors 501 are arranged in a matrix form. An image is displayed by the plurality of micro mirrors 501 in such a manner that the micro mirrors 501 reflect light emitted from a light source.

However, there is a demand for the miniature, lightweight, and high precise digital mirror device 500. When the digital mirror device 500 is miniaturized (for example, when a pixel pitch is decreased for high precision), and when the mirrors 501a and 501b are inclined, as illustrated in FIG. 15, the adjacent mirrors 501a and 501b come into contact with each other in some cases. Accordingly, there is a concern of the mirrors 501a and 501b not being normally operated. When the digital mirror device 500 is miniaturized, there is a request for increasing operation angles of the mirrors 501a and 501b so that light reflected by the mirrors 501a and 501b is not absorbed by an optical system (not illustrated).

SUMMARY

The invention can be realized in the following aspects or application examples.

APPLICATION EXAMPLE 1

According to this application example, there is provided a digital mirror device including: a substrate; a plurality of mirrors that are disposed at one surface of the substrate to be separated from the substrate; a mirror support post that is disposed between the substrate and the mirror and is connected to a part of the mirror to support the mirror; and a first electrode that is disposed between the substrate and the mirror to overlap with the other part of the mirror. The mirror includes a first portion that is connected to the mirror support post, a second portion that is a portion overlapping with the first electrode, and a third portion that is a portion between the first and second portions. A thickness of the second portion of the mirror is thinner than a thickness of the third portion.

According to the application example, the thickness of the second portion which is the portion overlapping with the first electrode is thinner than the thicknesses of other portions. Therefore, even when the gap between the mutually adjacent mirrors is decreased as compared with a conventional one and the plurality of mirrors are inclined in the same direction, the mutually adjacent mirrors can be prevented from interfering with each other. Accordingly, it is possible to prevent the mirrors from malfunctioning. It is possible to miniaturize the digital mirror device. Since the thickness of the second portion can be thinned, the weight of the mirrors can be reduced. Thus, the mirrors can operate at a high operation speed and the image quality can be improved.

APPLICATION EXAMPLE 2

The digital mirror device according to the application example preferably further includes a second electrode that is disposed between the substrate and the mirror to overlap with a portion different from the first and second portions of the mirror. The mirror preferably includes a fourth portion that is a portion overlapping with the second electrode and a fifth portion that is a portion between the first and fourth portions. A thickness of the fourth portion of the mirror is preferably thinner than a thickness of the fifth portion.

According to the application example, the thickness of the second portion which is the portion overlapping with the first electrode and the thickness of the fourth portion which is the portion overlapping with the second electrode are thinner than the thicknesses of other portions. Therefore, even when the gap between the mutually adjacent mirrors is decreased and the plurality of mirrors operate to be oriented in the same direction, the mutually adjacent mirrors can be prevented from interfering with each other. Accordingly, it is possible to prevent the mirrors from malfunctioning. It is possible to miniaturize the digital mirror device. Since the thicknesses of the second and fourth portions can be thinned, the weight of the mirrors can be reduced. Thus, the mirrors can operate at a high operation speed and the image quality can be improved.

APPLICATION EXAMPLE 3

In the digital mirror device according to the application example, the second portion of the mirror is preferably disposed along a side of the mirror.

According to the application example, the second portion is formed along the side of the mirror. Therefore, when the plurality of mirrors operate to be oriented in the same direction, the mutually adjacent mirrors can be prevented from interfering with each other. Since the second portion of the mirror can be thinned, the weight of the mirror can be reduced.

APPLICATION EXAMPLE 4

In the digital mirror device according to the application example, the fourth portion of the mirror is preferably disposed along a side of the mirror. The second and fourth portions are preferably disposed along two sides facing each other.

According to the application example, the second and fourth portions are formed along the two sides facing each other. Therefore, when the plurality of mirrors operate to be oriented in the same direction, the mutually adjacent mirrors can be prevented from interfering with each other. Since the second and fourth portions of the mirror can be thinned, the weight of the mirror can be reduced.

APPLICATION EXAMPLE 5

In the digital mirror device according to the application example, the second portion of the mirror is preferably disposed in an edge portion of the mirror.

According to the application example, the second portion is disposed in the edge portion of the mirror. Therefore, when the plurality of mirrors operate to be oriented in the same direction (the direction of the edge portion), the mutually adjacent mirrors can be prevented from interfering with each other. Since the second portion of the mirror can be thinned, the weight of the mirror can be reduced.

APPLICATION EXAMPLE 6

In the digital mirror device according to the application example, the fourth portion of the mirror is preferably disposed in an edge portion of the mirror. The second and fourth portions are preferably disposed in two edge portions located to be diagonal to each other.

According to the application example, the second and fourth portions are disposed in the edge portions of the mirror facing each other. Therefore, when the plurality of mirrors operate to be oriented in the same direction (the direction of the edge portion), the mutually adjacent mirrors can be prevented from interfering with each other. Since the second and fourth portions of the mirror can be thinned, the weight of the mirror can be reduced.

APPLICATION EXAMPLE 7

In the digital mirror device according to the application example, the second portion is preferably formed in a taper shape gradually thinning from a middle of the mirror to an end portion of the mirror.

According to the application example, the rear surface is thinned from the middle of the mirror to the end portion of the mirror. Therefore, even when the mirrors operate in the state in which the distance of the mutually adjacent mirrors is narrow, the mutually adjacent mirrors can be prevented from coming into contact with each other.

APPLICATION EXAMPLE 8

In the digital mirror device according to the application example, the second portion is preferably formed in a stepped shape thinning step by step from a middle of the mirror to an end portion of the mirror.

According to the application example, the rear surface is thinned step by step from the middle of the mirror to the end portion of the mirror. Therefore, even when the mirrors operate in the state in which the distance of the mutually adjacent mirrors is narrow, the mutually adjacent mirrors can be prevented from coming into contact with each other.

APPLICATION EXAMPLE 9

According to this application example, there is provided a method of manufacturing a digital mirror device, including: forming a sacrificial layer on one surface side of a substrate; forming an opening hole which becomes a mirror support post of a mirror in the sacrificial layer; forming a first mirror film above the sacrificial layer and in the opening hole; forming at least a second portion in which an end portion of a region which becomes the mirror on a side of the substrate in the first mirror film is thinner than a middle of the region; and forming the mirror by removing the sacrificial layer.

According to the application example, the second portion is formed so that the thickness of the end portion of the rear surface of the mirror is thinner than the thickness of the middle of the mirror. Therefore, even when the gap between the mutually adjacent mirrors is decreased and the plurality of mirrors operate to be oriented in the same direction, the mutually adjacent mirrors can be prevented from interfering with each other. Accordingly, it is possible to prevent the mirrors from malfunctioning. It is possible to miniaturize the digital mirror device. Since the thickness of the second portion of the mirror can be thinned, the weight of the mirrors can be reduced. Thus, the mirrors can operate at a high operation speed and the image quality can be improved.

APPLICATION EXAMPLE 10

In the method of manufacturing the digital mirror device according to the application example, the forming of the second portion preferably includes forming a resist pattern in the region which becomes the mirror in the first mirror film and performing an isotropic etching process on the first mirror film using the resist pattern as a mask.

According to the application example, since the isotropic etching process is performed using the resist pattern as the mask, an etching amount of the end portion can be configured to be greater than that of the middle of the mirror. Thus, a thin portion with a substantial taper shape can be formed in the end portion of the rear surface of the mirror.

APPLICATION EXAMPLE 11

In the method of manufacturing the digital mirror device according to the application example, the forming of the second portion preferably includes forming a second mirror film with an etching rate less than the first mirror film above the first mirror film, forming a resist pattern in a region which becomes the mirror above the second mirror film, and performing an etching process on the first and second mirror films using the resist pattern as a mask.

According to the application example, the first mirror film and the second mirror film with different the etching rates are stacked and the etching process is performed on the end portions of the mirrors. An etching amount of the first mirror film with the larger etching rate in the lower layer can be configured to be greater than that of the second mirror film in the upper layer. Accordingly, the thicknesses of the end portions of the rear surface (the side of the substrate) of the mirror can be thinned than the thickness of the middle of the mirror (specifically, for example, the rear surface of the mirror can be formed in a stepped shape).

APPLICATION EXAMPLE 12

According to this application example, there is provided a method of manufacturing the digital mirror device, including: forming a sacrificial layer on one surface side of a substrate; forming an opening hole which becomes a mirror support post of a mirror in the sacrificial layer; forming a mirror film in the opening hole; and transferring the mirror in which at least a second portion is formed so that a thickness of an end portion of the mirror on a side of the substrate is thinner than a middle of the mirror, to the sacrificial layer and above the opening hole to be connected to the mirror film of the opening hole.

According to the application example, since the mirror is formed through transferring, the shape of the mirror before the transferring can be formed relatively easily.

APPLICATION EXAMPLE 13

According to this application example, there is provided an image display apparatus including the foregoing digital mirror device.

According to the application example, since the image display apparatus include the foregoing digital mirror device, the mirror can be smoothly operated and the miniaturization can be realized. Accordingly, it is possible to provide the image display apparatus capable of improving image quality with miniaturization.

BRIEF DESCRIPTION OF THE DRAWINGS

The invention will be described with reference to the accompanying drawings, wherein like numbers reference like elements.

FIG. 13 is a schematic plan view illustrating a digital mirror device according to a modification example when viewed from the upper side.

DESCRIPTION OF EXEMPLARY EMBODIMENTS

Hereinafter, implemented embodiments of the invention will be described with reference to the drawings. The drawings to be used are appropriately enlarged or contracted to be displayed so that described portions can be recognized.

For example, when "above a subject" is described in the following forms, "above a subject" are assumed to mean that constituent elements are disposed to come into contact above a subject, or constituent elements are disposed above a subject via other constituent elements, or some of constituent elements are disposed to come into contact above a subject and some of the constituent elements are disposed via other constituent elements.

First Embodiment
Configuration of Projector as Image Display Apparatus

Figure 1:
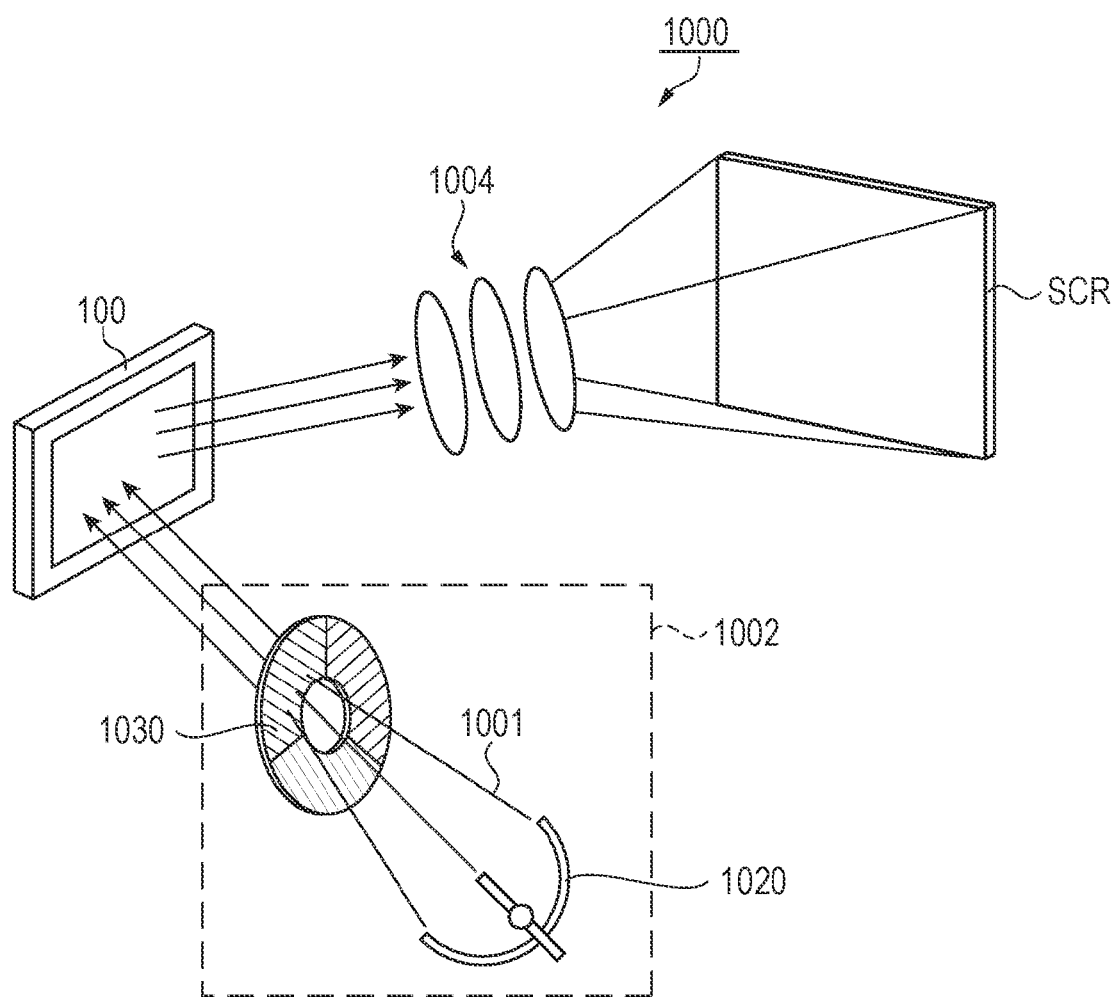
FIG. 1 is a schematic diagram illustrating an optical system of a projector which is an image display apparatus.

FIG. 1 is a schematic diagram illustrating an optical system of a projector which is an image display apparatus. Hereinafter, the optical system of the projector will be described with reference to FIG. 1.

As illustrated in FIG. 1, a projector 1000 is configured to include a light source device 1002, a digital mirror device 100 that modulates light 1001 emitted from the light source device 1002 according to image information, and a projection optical system 1004 that projects the modulated light from the digital mirror device 100 as projection image.

The light source device 1002 includes a light-emitting element 1020 and a fluorescent substrate 1030. The light source device 1002 is a laser light source that emits blue laser light. The fluorescent substrate 1030 is disposed on an optical path of the laser light emitted from the light-emitting element 1020.

Configuration of Digital Mirror Device

Figure 2:
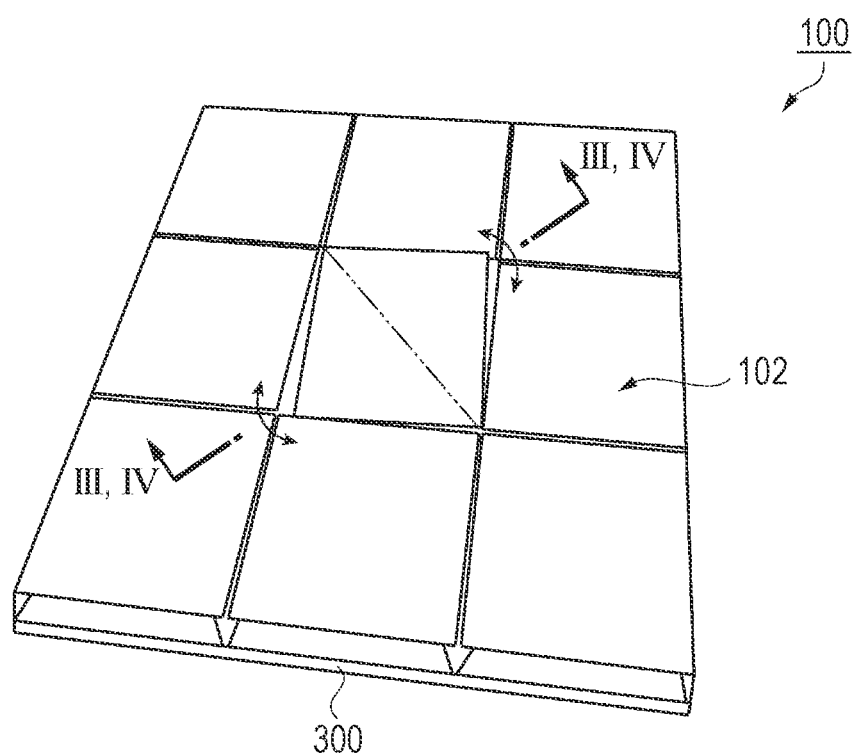
FIG. 2 is a schematic diagram illustrating the configuration of a digital mirror device according to a first embodiment.
Figure 3:
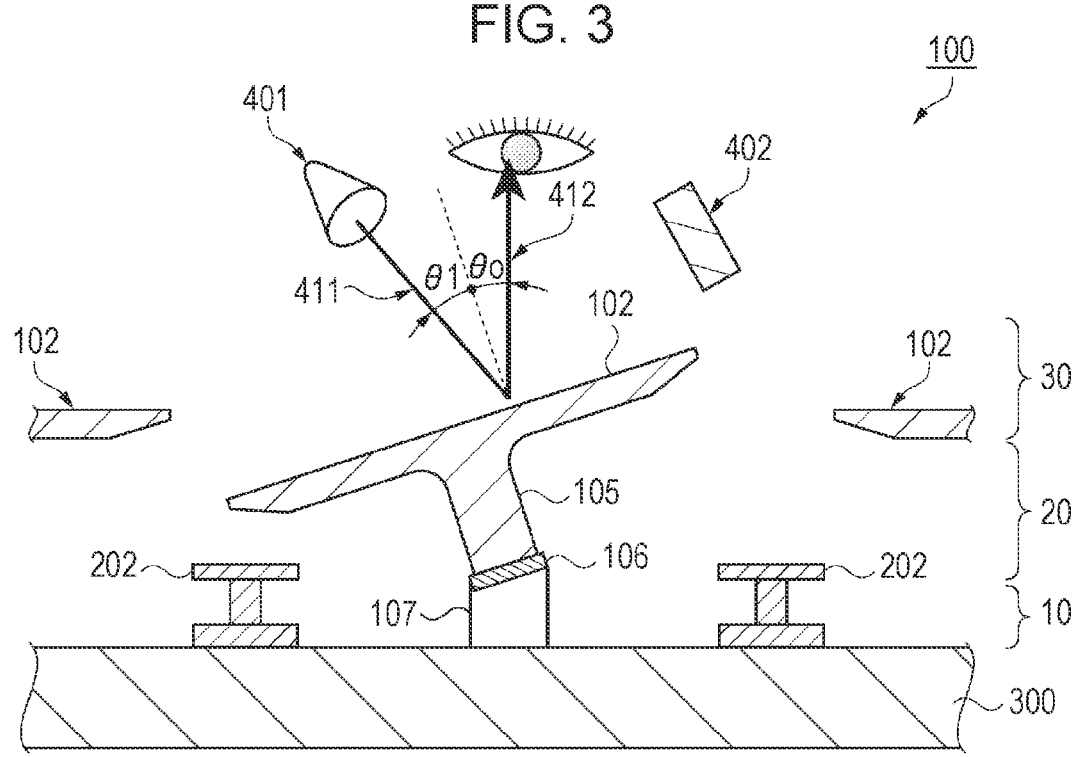
FIG. 3 is a schematic sectional view taken along the line III-III in the digital mirror device illustrated in FIG. 2.
Figure 4:
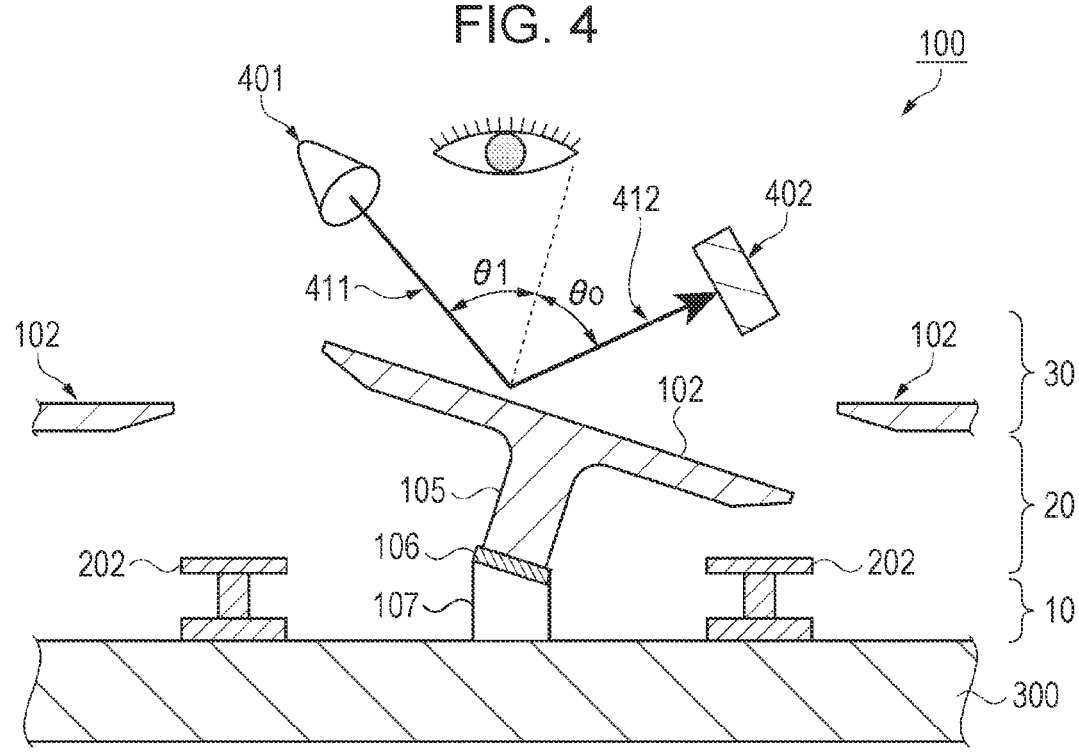
FIG. 4 is a schematic sectional view taken along the line IV-IV in the digital mirror device illustrated in FIG. 2.

FIG. 2 is a schematic diagram illustrating the configuration of a digital mirror device. FIGS. 3 and 4 are schematic sectional views taken along the line III-III and the line IV-IV in the digital mirror device illustrated in FIG. 2 and are schematic sectional views illustrating an operation of mirrors of the digital mirror device. Hereinafter, the configuration and operation of the digital mirror device will be described with reference to FIGS. 2 to 4.

As illustrated in FIG. 2, in the digital mirror device (DMD) 100, a plurality of mirrors 102 are disposed in a matrix form on the upper side of the substrate 300 via torsion hinges 106 and support posts 105 (see FIG. 3). The substrate 300 is, for example, a silicon substrate. A reflection metal film that reflects light is formed on the surface of the mirror 102. An aluminum film can be exemplified as the reflection metal film.

As illustrated in FIG. 3, the digital mirror device 100 according to the embodiment includes three main portions, a lower portion 10 including a control circuit unit and a pair of hinge support posts 107, a middle portion 20 including an electrode 202 and the torsion hinge 106, and an upper portion 30 including the mirror 102.

The control circuit unit of the lower portion 10 is used to selectively control an operation of each mirror 102 of the digital mirror device 100. The control circuit unit can be assembled using a standard CMOS technology and is similar to a static random access memory (SRAM).

The middle portion 20 is configured by the electrode 202, the torsion hinge 106, and the mirror support post 105. The torsion hinge 106 is disposed between the pair of hinge support posts 107 and both end portions of the torsion hinge 106 are rotatably supported by the pair of hinge support posts 107. The mirror 102 is drawn to one electrode 202 (first electrodes) by an electrostatic force of the electrode 202. The torsion hinge 106 twists when the mirror 102 is drawn to the one electrode 202 by an electrostatic force of the electrode 202 and returns when voltage is not applied to the electrode 202. The electrostatic force is inversely proportional to a square of distance between the mirror 102 and the electrode 202. Thus, this influence of the electrostatic force is apparent when the mirror 102 is inclined to one of two directions by an electrostatic force of the electrode 202.

The mirror 102 includes a first portion that is connected to the mirror support post 105, a second portion that is a portion overlapping with one electrode 202 when the mirror 102 is inclined, and a third portion which is a portion between the first and second portions. The thickness of the second portion of the mirror 102 is thinner than the thickness of the third portion. In other words, a taper is formed in the second portion of the mirror 102.

Further, the mirror 102 further includes a fourth portion that is a portion overlapping with the other electrode 202 (second electrode) when the mirror 102 operates in the opposite direction to the above direction and a fifth portion that is a portion between the first and fourth portions. The thickness of the fourth portion of the mirror 102 is thinner than the thickness of the fifth portion. A taper is also formed in the fourth portion, as described above.

The upper portion 30 includes the mirror 102 that has a flat reflection metal film on the upper surface. The torsion hinge 106 is formed to serve as a part of the mirror 102. On the lower side of the mirror 102, a gap is provided so that rotation is allowed at a predetermined angle while a minimum distance is maintained.

FIG. 3 is a sectional view illustrating a part of the digital mirror device 100 according to an embodiment of the invention when directional light 411 from an illumination light source 401 forms an incident angle θ1. Deflected light 412 has an angle θo when the digital mirror device 100 is positioned in a normal direction. In a digital operation mode, this configuration is generally referred to as an "ON" position.

FIG. 4 is a sectional view illustrating the same part of the digital mirror device 100 while the mirror 102 rotates toward the electrode 202 (second electrode) on the opposite side. The directional light 411 and the deflective light 412 form larger angles θ1 and θo. The deflective light 412 is emitted to a light absorption device 402.

Figure 5:
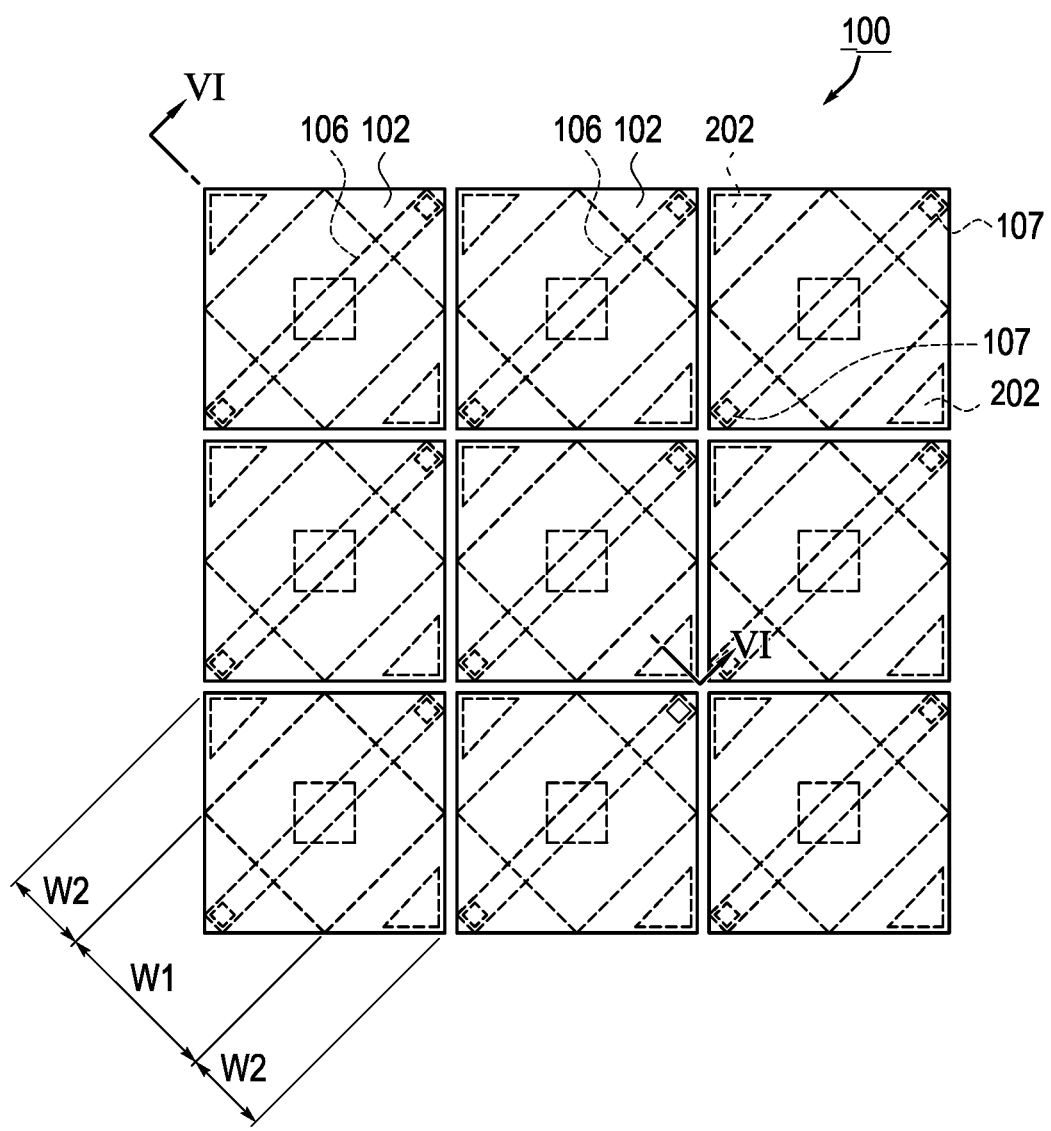
FIG. 5 is a schematic plan view illustrating the digital mirror device when viewed from the upper side.
Figure 6A:
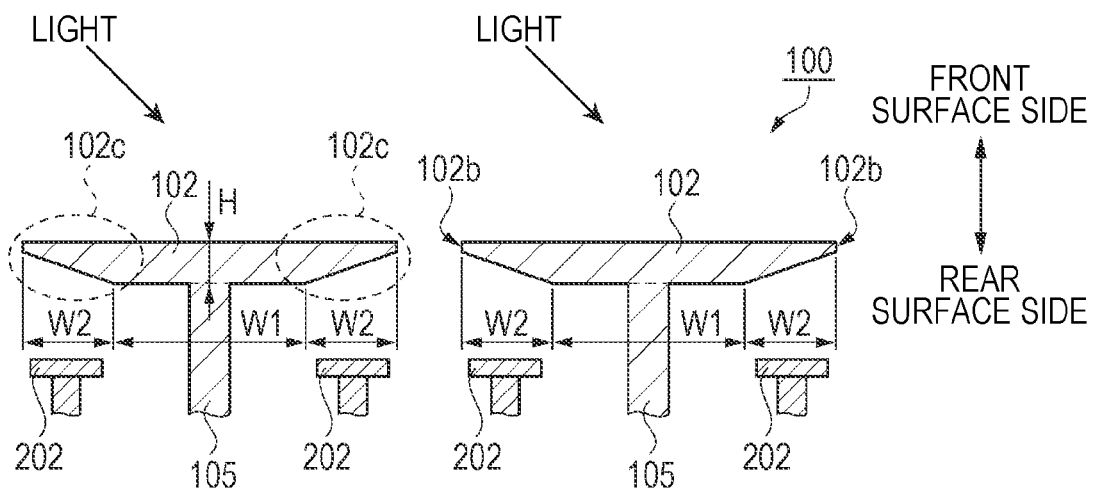
FIGS. 6A and 6B are schematic sectional views taken along the line VI-VI in the digital mirror device illustrated in FIG. 5.
Figure 6B:
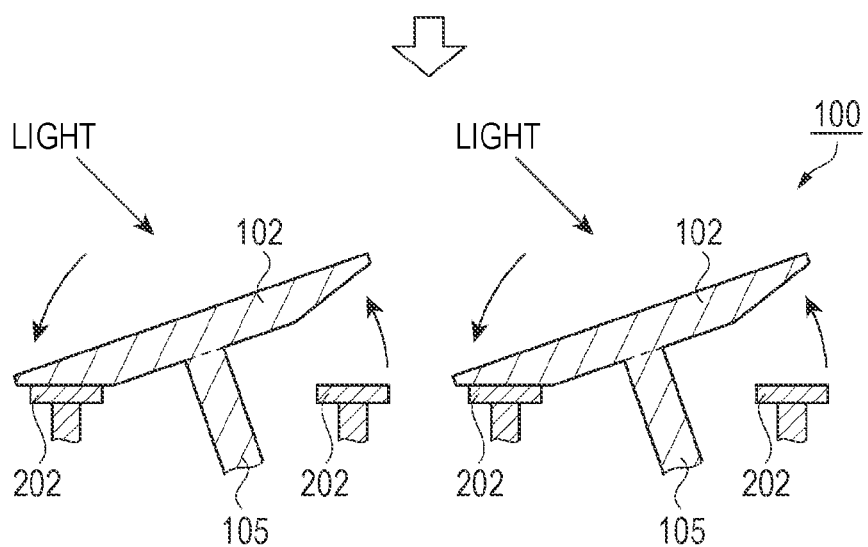

FIG. 5 is a schematic plan view illustrating the digital mirror device when viewed from the upper side. FIGS. 6A and 6B are schematic sectional views taken along the line VI-VI_in the digital mirror device illustrated in FIG. 5. FIG. 6A is a schematic sectional view illustrating a state in which the mirror does not operate. FIG. 6B is a schematic sectional view illustrating a state in which the mirror operates. Hereinafter, mainly the configuration of the mirror in the digital mirror device will be described with reference to FIGS. 5, 6A, and 6B.

In the digital mirror device 100, as illustrated in FIG. 5, the mirrors 102 are disposed in a matrix form via the mirror support posts 105 on the upper side of the substrate 300.

As illustrated in FIGS. 6A and 6B, the digital mirror device 100 includes the mirrors 102 and the mirror support posts 105 supporting the mirrors 102. The mirror 102 has a region W1 of a middle portion and regions W2 on the end sides. Specifically, tapers are formed from the region W1 of the middle portion to the regions W2 of the end portions. That is, the thicknesses of the regions W2 on the end sides (edge portions) are thinner than the thickness H of the region W1 of the middle portion.

Specifically, the regions W2 on the end sides of the rear surface (on the side of the substrate 300) of the mirror 102 have taper shapes so that the thickness of the mirror 102 gradually thins from the middle portion to the outer circumferential end portions 102b. In the embodiment, the regions W2 on the end sides with the thin thickness are edge portions (end portions 102b) of the rear surface of the mirror 102. The front surface of the mirror 102 is configured to be flat.

The portions of the regions W2 on the end sides in the mirror 102 are referred to as thin portions. As illustrated in FIG. 6B, at least parts of the tapers of the thin portions come into contact with the electrodes 202 which also have a role of stoppers when the mirrors 102 are inclined in the direction of the tapers.

In the digital mirror device 100 according to the embodiment, four corners of the outer circumference of the mirrors 102 have taper shapes. When there is no concern of the mutually adjacent mirrors 102 coming into contact with each other, at least one edge portion of the four corners may have the taper shape or two edge portions facing each other may have the taper shapes.

When the mirror 102 is activated, the portions having the taper shapes in the mirror 102 hitting against the electrode 202 which also has the role of the stopper and the mirror 102 stop. Since the end portion sides of the rear surface of the mirror 102 have the taper shapes, the mirror 102 can be inclined at a large angle. Thus, it is possible to prevent reflected light from being sucked to the optical system.

By thinning the end portion sides of the rear surface of the mirror 102, it is possible to prevent the mutually adjacent mirrors 102 from coming into contact with each other at the time of the activation of the mirrors 102. Specifically, when the thicknesses of the end portion sides of the mirror 102 are the thickness H of the middle portion of the mirror 102 and the mirror 102 operates centering on the torsion hinge 106, the outer circumferential end portions 102b overhang on the side of the adjacent mirror 102 and move. Accordingly, in order to smoothly operate the mirror 102, the mutually adjacent mirrors 102 have to be separated at a distance.

However, since the portions on the end sides overhanging at the time of the operation have the thin taper shapes, the mutually adjacent mirrors 102 are prevented from coming into contact with each other even when the mirrors 102 operate. Accordingly, the distance between the mutually adjacent mirrors 102 can be reduced, and thus the digital mirror device 100 can be miniaturized. The material of the mirror 102 is, for example, aluminum (Al) or aluminum alloy.

Method of Manufacturing Digital Mirror Device

Figure 7:
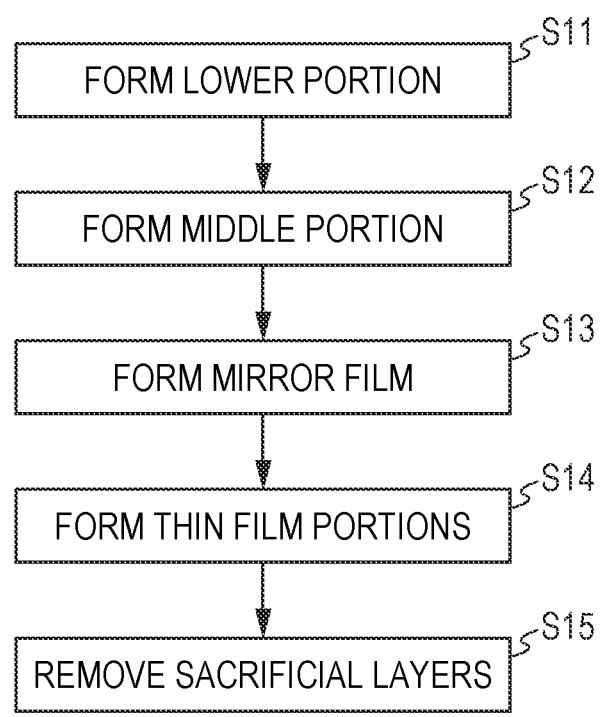
FIG. 7 is a flowchart illustrating a method of manufacturing the digital mirror device in a processing order.

FIG. 7 is a flowchart illustrating a method of manufacturing the digital mirror device in a processing order. FIGS. 8A to 9C are schematic sectional views illustrating parts of the method of manufacturing the digital mirror device in the processing order. Hereinafter, the method of manufacturing the digital mirror device will be described with reference to FIGS. 7 to 9C.

Figure 8A:
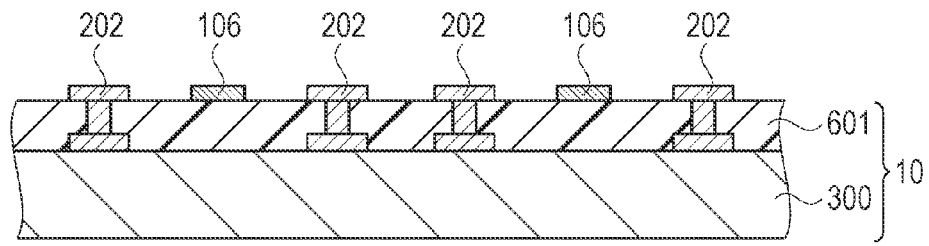
FIGS. 8A to 8D are schematic sectional views illustrating parts of the method of manufacturing the digital mirror device in the processing order.

First, as illustrated in FIG. 7, the lower portion 10 is formed in step S11. Specifically, as illustrated in FIG. 8A, a control circuit (not illustrated) is formed in the substrate 300 using a known method. Thereafter, a first sacrificial layer 601 is piled on the surface of the substrate 300. As a method of manufacturing the first sacrificial layer 601, PECVD of an organic polymer or a photoresist spin coat can be used.

Next, the electrodes 202, the torsion hinges 106, and the like are formed above the first sacrificial layer 601. The electrodes 202 and the torsion hinges 106 are formed using, for example, a known film forming technology, a photolithographic technology, or an etching technology.

Figure 8B:
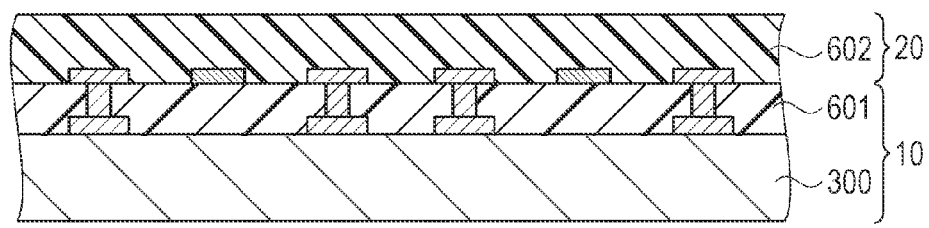

In step S12, the middle portion 20 is formed. Specifically, as illustrated in FIG. 8B, a second sacrificial layer 602 with a thickness of about 1 μm is piled above the first sacrificial layer 601. The second sacrificial layer 602 is formed as in the foregoing first sacrificial layer 601. The thickness of the second sacrificial layer 602 decides the heights of the mirrors 102 on the torsion hinges 106.

Figure 8C:
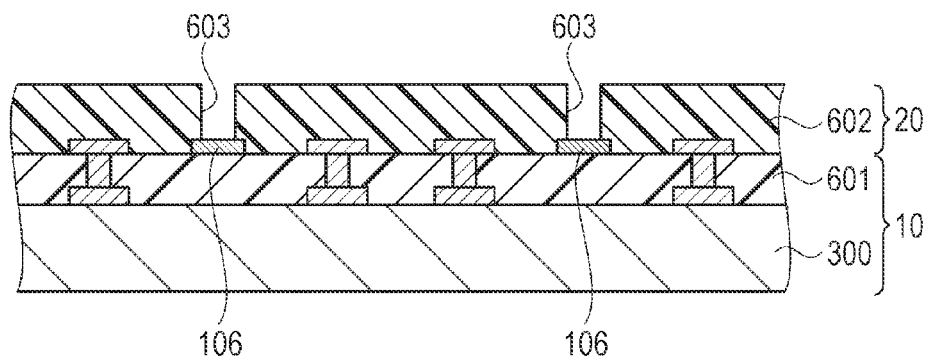

In step S13, a mirror film 102*a* which becomes the mirrors 102 of the upper portion 30 is formed. Specifically, as illustrated in FIG. 8C, openings 603 are first formed in the second sacrificial layer 602. For example, an etching method using a mask is used as a method of forming the openings 603. Accordingly, the surfaces of the torsion hinges 106 are exposed.

Figure 8D:
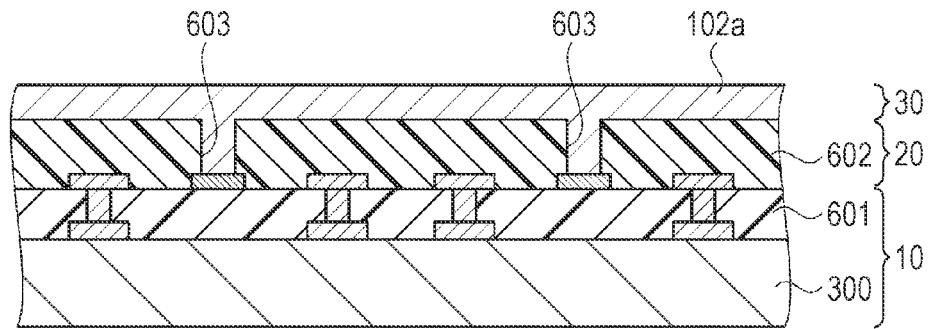

Next, in the steps illustrated in FIG. 8D, the mirror film 102*a* is formed across the openings 603 from the surface of the second sacrificial layer 602. The mirror film 102*a* is an aluminum film, as described above.

Figure 9A:
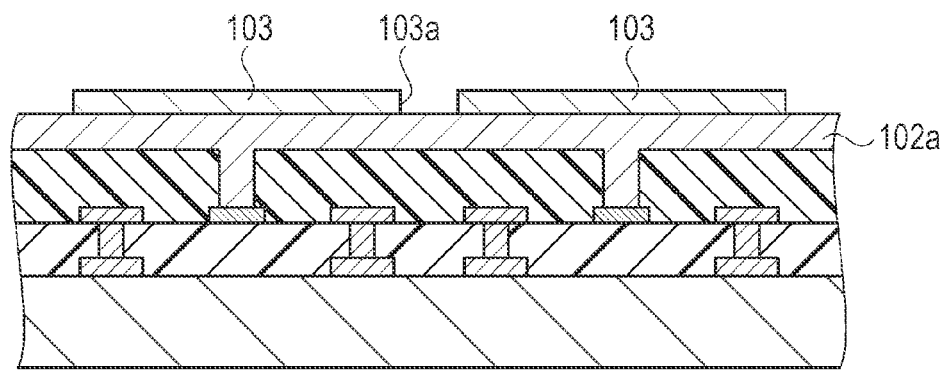
FIGS. 9A to 9C schematic sectional views illustrating parts of the method of manufacturing the digital mirror device in the processing order.

In step S14, thin portions 102*c* are formed in the mirror film 102*a*. Specifically, as illustrated in FIG. 9A, resist patterns 103 are first formed above the mirror film 102*a* using a photoresist method. Accordingly, the resist patterns 103 having opening holes 103*a* between the mutually adjacent mirrors 102 are formed.

Figure 9B:
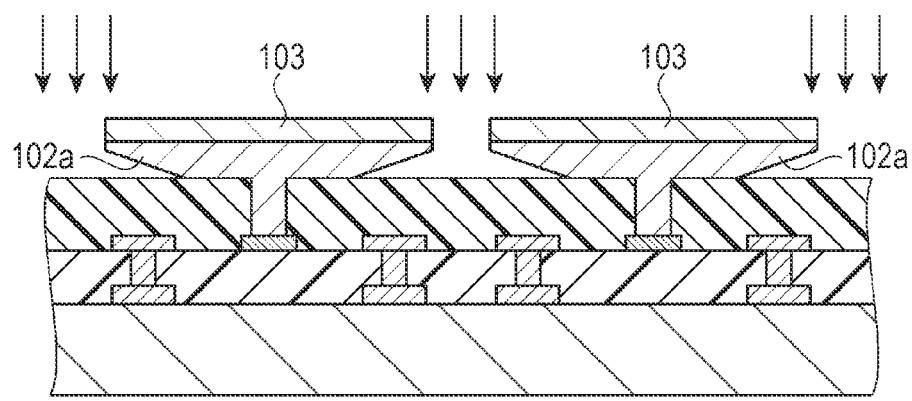

Next, as illustrated in FIG. 9B, an etching process (side etching) is performed on the mirror film 102*a*. Specifically, an isotropic etching process is performed on the mirror film 102*a* using the resist patterns 103 as masks. Accordingly, the rear surface (the side of the second sacrificial layer 602) of the mirror film 102*a* is etched in the substantial taper shapes. Thereafter, the resist patterns 103 are removed performing asking.

Figure 9C:
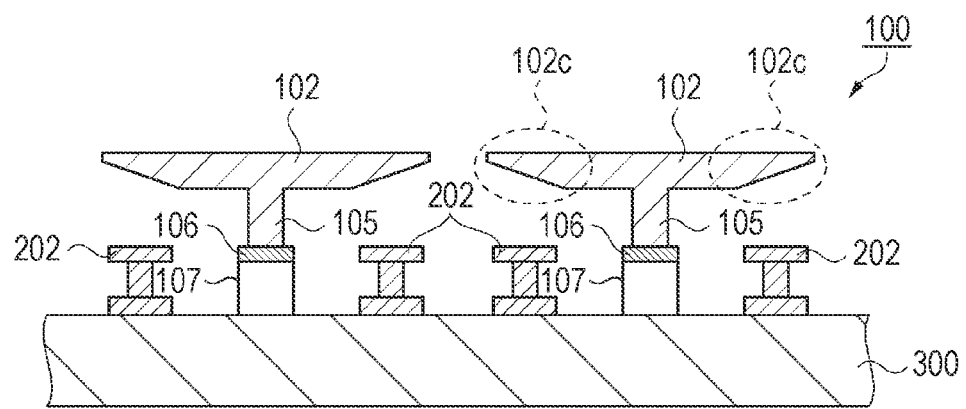

In step S15, the mirrors 102 are completed by removing the first sacrificial layer 601 and the second sacrificial layer 602. Specifically, as illustrated in FIG. 9C, the plurality of mirrors 102 are separated by removing the first sacrificial layer 601 and the second sacrificial layer 602 using a fluorine gas. The digital mirror device 100 is completed in the above-described manner.

As described above in detail, the following advantages can be obtained in the digital mirror device 100, the method of manufacturing the digital mirror device 100, and the projector 1000 according to the first embodiment.

(1) In the digital mirror device 100 according to the first embodiment, the thicknesses of the end portions of the rear surface (the side of the substrate 300) of the mirror 102 are thinner than the thickness of the middle of the mirror 102 (specifically, the end portions have the taper shapes). Therefore, even when the distance between the mutually adjacent mirrors 102 is decreased and the plurality of mirrors 102 operate to be oriented in the same direction, the mutually adjacent mirrors 102 can be prevented from interfering with each other. Accordingly, it is possible to prevent the mirrors 102 from malfunctioning. It is possible to miniaturize the digital mirror device 100.

(2) In the digital mirror device 100 according to the first embodiment, an occupancy ratio of the mirrors 102 to pitches (pixel pitches) of the mirrors 102 can be increased. Therefore, it is possible to improve a reflectance, and thus it is possible to obtain brighter display.

(3) In the digital mirror device 100 according to the first embodiment, the distance between the mutually adjacent mirrors 102 can be decreased. Therefore, it is possible to reduce stray light caused due to diffused reflection of a light ray intruding between the mirrors 102. Further, since the gap between the mirrors 102 is narrowed, diffracted light is weakened, and thus a deterioration in a contrast ratio can be suppressed.

(4) In the digital mirror device 100 according to the first embodiment, the gap between the mirrors 102 is narrowed, absorbed light of the digital mirror device 100 can be reduced, and thus it is possible to reduce an increase in the temperature of the digital mirror device 100. Accordingly, since a cooling system that cools the digital mirror device 100 can be miniaturized, it is possible to realize the miniaturization and low cost of the entire apparatus. Further, since the thin portions are present in the mirror 102, it is possible to improve cooling efficiency of the mirrors 102.

(5) In the digital mirror device 100 according to the first embodiment, the gap between the mirrors 102 can be narrowed. Since intrusion of light to the periphery of an active element such as a CMOS disposed on the lower side of the mirror 102 can be suppressed and the increase in the temperature can be suppressed, it is possible to suppress an erroneous operation (off-leak or the like) caused due to heat of the active element, and thus it is possible to suppress display defects.

(6) In the digital mirror device 100 according to the first embodiment, the thicknesses of the end portions of the mirrors 102 can be thinned. Therefore, the weight of the mirrors 102 can be reduced, and thus the mirrors 102 can operate at a high operation speed. Accordingly, the ON time can be lengthened, and thus it is possible to improve projection illuminance. Right and left crosstalk can be reduced at the time of 3D display in accordance with a frame sequential scheme. Further, by improving a vertical scanning frequency of a panel, it is possible to improve a frame rate, and thus it is possible to suppress color break-up.

(7) In the digital mirror device 100 according to the first embodiment, the thin portions are provided in the mirrors 102. Thus, when the mirrors 102 collide against the electrodes 202 (stoppers), the mirrors 102 are bent. Therefore, shock to the electrodes 202 can be absorbed. Accordingly, accumulation of damage to the electrodes 202 can be suppressed, and thus it is possible to improve reliability of the digital mirror device 100.

(8) In the method of manufacturing the digital mirror device 100 according to the first embodiment, the end portions of the rear surface of the mirror 102 can be formed in the taper shapes using a photolithographic method and an etching method. Therefore, the end portions can be formed in desired shapes using an existing apparatus. Accordingly, it is possible to prevent the mutually adjacent mirrors 102 from malfunctioning. The distance between the mutually adjacent mirrors 102 can be decreased, and thus it is possible to miniaturize the digital mirror device 100. Since thicknesses of the end portions of the mirror 102 are thinned, the weight of the mirrors 102 can be reduced, and thus the mirrors 102 can operate at a high operation speed. Further, since the operation angle of the mirror 102 can be increased, it is not necessary to lengthen the distance between the torsion hinge 106 and the mirror 102 to increase the operation angle. Accordingly, it is possible to suppress the cost (for example, a material cost or a processing cost) in the manufacturing steps.

(9) Since the projector 1000 according to the embodiment includes the foregoing digital mirror device 100, the mirrors 102 can be smoothly operated and can be miniaturized. Accordingly, it is possible to provide the projector 1000 capable of improving image quality with miniaturization.

(10) In the projector 1000 according to the embodiment, the inclinations of the mirrors 102 can be increased. Therefore, since a lens which has a smaller F value and is bright (sucks a light ray of a broad angle) can be used, it is possible to further improve brightness.

Second Embodiment
Configuration of Digital Mirror Device

Figure 10A:
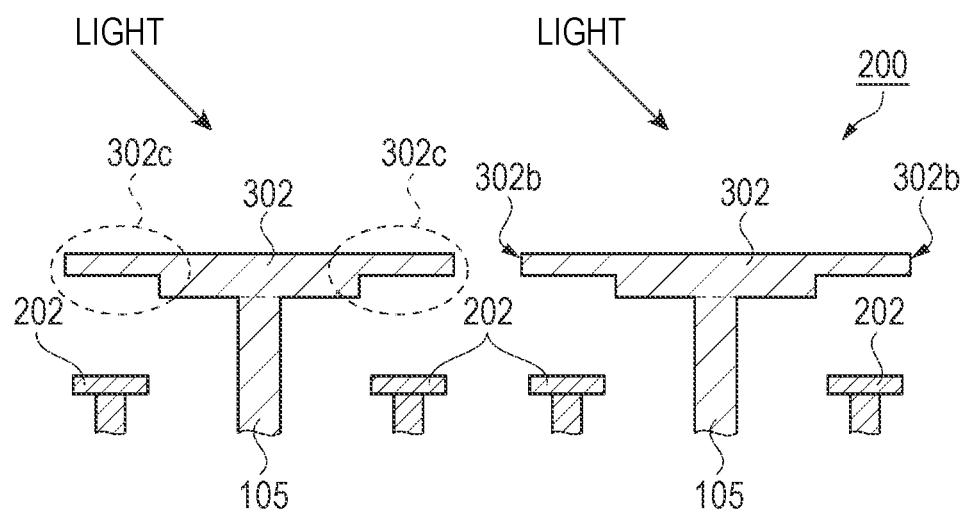
FIGS. 10A and 10B are schematic sectional views illustrating the configuration and operation of a digital mirror device according to a second embodiment.
Figure 10B:
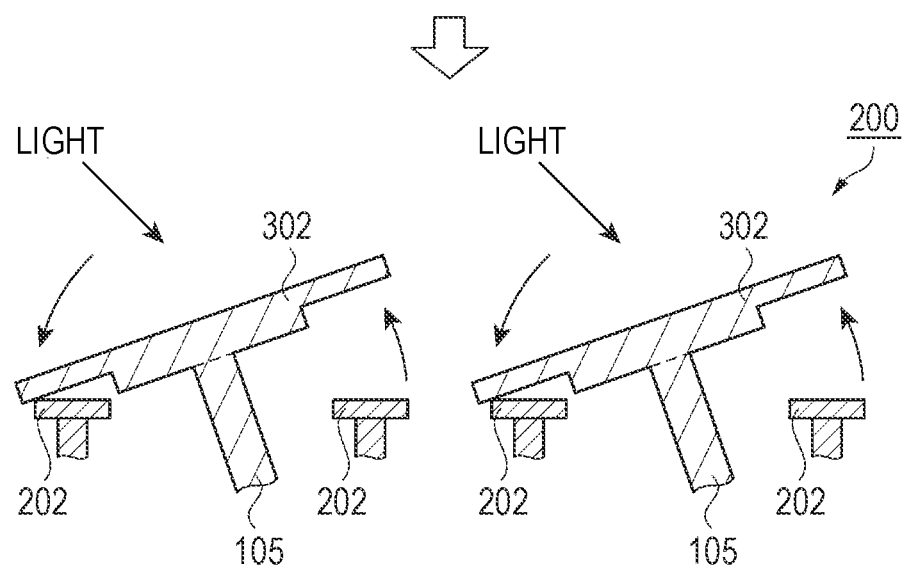

FIGS. 10A and 10B are schematic sectional views illustrating the configuration and operation of a digital mirror device according to a second embodiment. Hereinafter, the configuration and operation of the digital mirror device will be described with reference to FIG. 10.

A digital mirror device 200 according to the second embodiment is different from the digital mirror device 100 according to the above-described first embodiment in that thin portions 302c of mirrors 302 have changed shapes and the remaining of the digital mirror device 200 is substantially the same. Therefore, in the second embodiment, the differences from the first embodiment will be described in detail and the description of the other overlaps will be appropriately omitted.

In the digital mirror device illustrated in FIGS. 10A and 10B, the mirrors 302 are disposed in a matrix form via the mirror support posts 105 on the upper side of the substrate 300 as in the first embodiment (see FIG. 5: the mirrors 102 in FIG. 5). The thin portions 302c of the mirrors 302 are formed in stepped shapes (step shape) as differences from the first embodiment.

Specifically, the end portions of the rear surface (the side of the substrate 300) of the mirror 302 are formed in the stepped shapes and the thicknesses of the mirrors 302 are thinned from the middle of the mirrors 302 to the outer circumferential end portions 302b. Regions of the thin portions 302c with the thin thicknesses are formed in the outer circumferential end portions 302b (edge portions) of the mirrors 302 as in the first embodiment. The surfaces (incident side of light) of the mirrors 302 have flat shapes.

In the digital mirror device 200 according to the embodiment, the edge portions of the mirrors 302 are formed in the stepped shapes. When there is no concern of the mutually adjacent mirrors 302 coming into contact with each other, at least one edge portion of the four corners may have the stepped shape or two edge portions (for example, two edge portions facing each other) may have the stepped shapes.

When the mirror 302 is activated, operations of the portions having the stepped shapes in the mirror 302 hitting against the electrode 202 which also has the role of the stopper and the mirror 302 stop. Since the end portion sides of the rear surface of the mirror 302 have the stepped shapes, the mirror 302 can be inclined at a large angle. Thus, it is possible to prevent reflected light from being sucked to the optical system such as a projection lens.

By thinning the end portion sides of the rear surface of the mirror 302, it is possible to prevent the mutually adjacent mirrors 302 from coming into contact with each other at the time of the activation of the mirrors 302. When the mirrors 302 are drawn toward the electrodes 202 by the electrostatic force of the electrode 202, the mirrors 302 are inclined centering on the twisted torsion hinges 106 in the directions of the edge portions. Since the portions on the end sides of the rear surfaces of the mirrors 302 overhanging at the time of the inclined operation have the thin stepped shapes, the mutually adjacent mirrors 302 are prevented from coming into contact with each other even when the mirrors 302 operate. Accordingly, the distance between the mutually adjacent mirrors 302 can be reduced, and thus the digital mirror device 200 can be miniaturized.

Method of Manufacturing Digital Mirror Device

FIGS. 11A to 12C are schematic sectional views illustrating parts of the method of manufacturing the digital mirror device according to the second embodiment in the processing order. Hereinafter, the method of manufacturing the digital mirror device will be described with reference to FIGS. 7 and 11A to 12C.

Figure 11A:
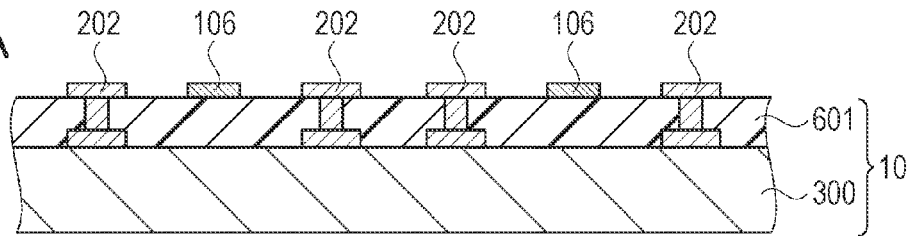
FIGS. 11A to 11D are schematic sectional views illustrating parts of the method of manufacturing the digital mirror device in the processing order.
Figure 11B:
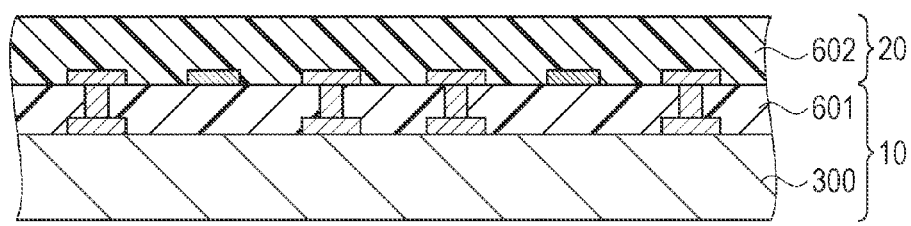
Figure 11C:
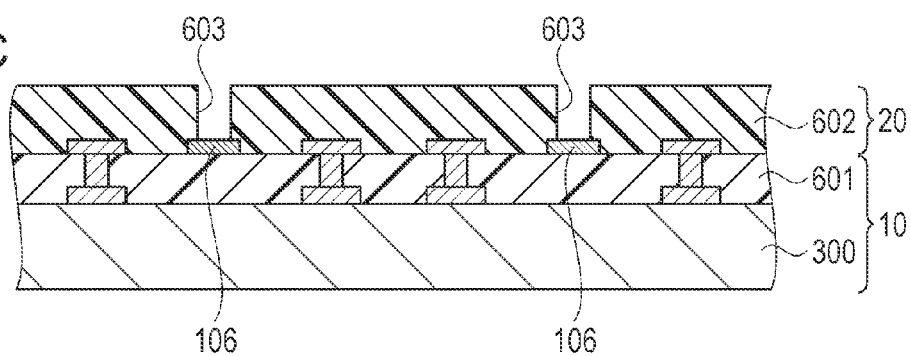

Steps (the steps S11 and S12) illustrated in FIGS. 11A to 11C are the same as the steps of FIGS. 8A to 8C of the first embodiment.

Figure 11D:
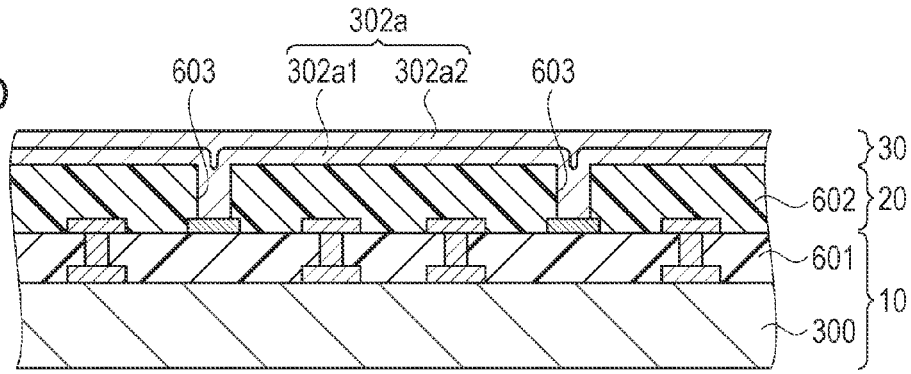

In step S13, a mirror film 302a is formed. Specifically, as illustrated in FIG. 11D, a first mirror film 302a1 and a second mirror film 302a2 included in the mirror film 302a are first formed in openings 603 and above a second sacrificial layer 602. The material of the first mirror film 302a1 disposed in the lower layer has a larger etching rate than the material of the second mirror film 302a2 disposed in the upper layer.

Figure 12A:
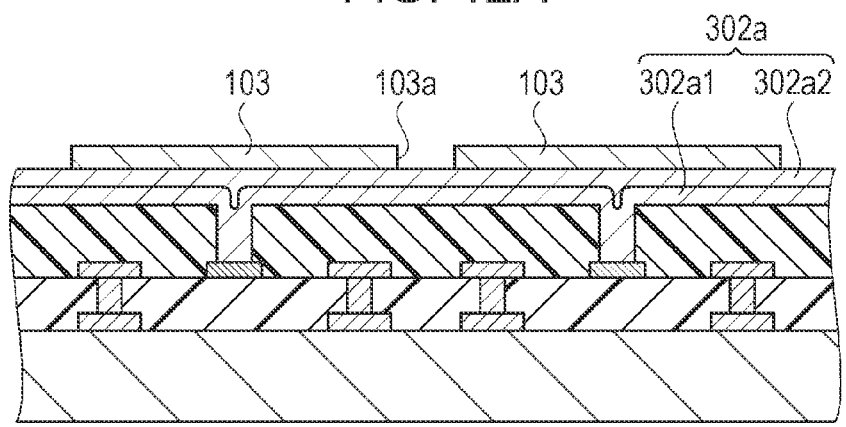
FIGS. 12A to 12C are schematic sectional views illustrating parts of the method of manufacturing the digital mirror device in the processing order.

Next, in step S14, the thin portions 302c are formed in the mirror film 302a. Specifically, as illustrated in FIG. 12A, resist patterns 103 are first formed above the mirror film 302a using a photoresist method. Accordingly, the resist patterns 103 having opening holes 103a between the mutually adjacent mirrors 302 are formed.

Figure 12B:
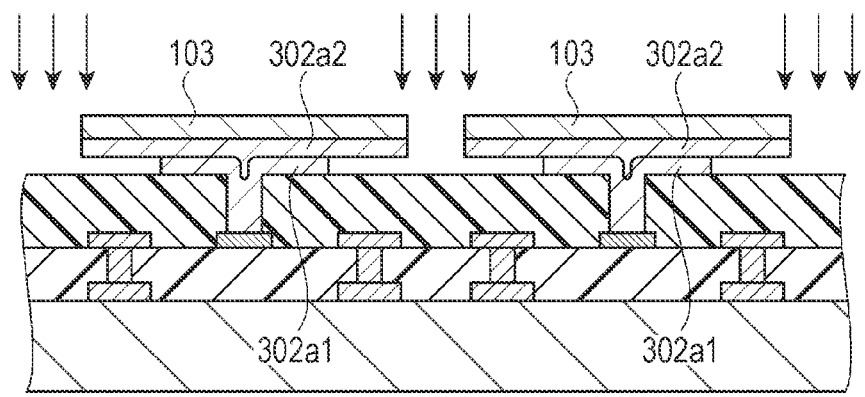

Next, as illustrated in FIG. 12B, an etching process (side etching) is performed on the mirror film 302a (302a1 and 302a2). Specifically, an etching process (side etching) is performed on the first mirror film 302a1 and the second mirror film 302a2 using the resist patterns 103 as masks. Since the etching rate of the first mirror film 302a1 formed in the lower layer is larger than that of the second mirror film 302a2 formed in the upper layer, the first mirror film 302a1 is etched faster than the second mirror film 302a formed in the upper layer. Accordingly, the end portions of the rear surface (the side of the substrate) of the mirror 302 configured to include the first mirror film 302a1 and the second mirror film 302a2 are formed in the stepped shapes.

Figure 12C:
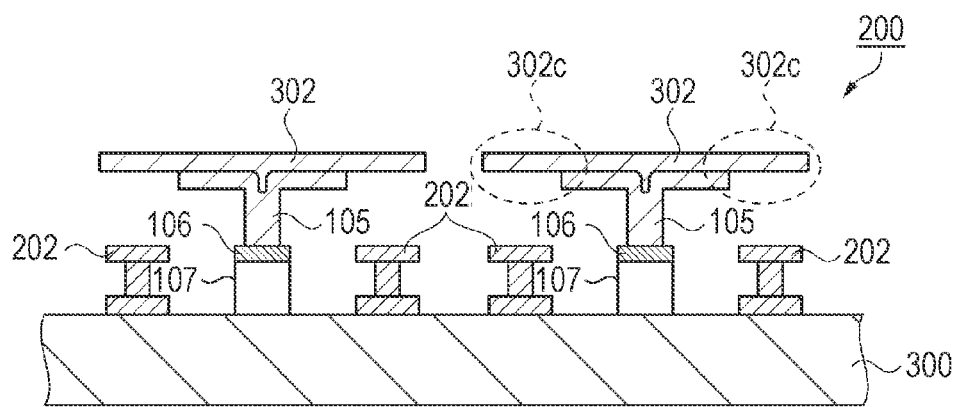

Next, as illustrated in FIG. 12C (step S15), the mirrors 302 are completed by removing the first sacrificial layer 601 and the second sacrificial layer 602. Specifically, the plurality of mirrors 302 are separated by removing the first sacrificial layer 601 and the second sacrificial layer 602 using a fluorine gas. The mirrors 302 and the digital mirror device 200 are completed in the above-described manner.

As described above in detail, the following advantages can be obtained in the digital mirror device 200 and the method of manufacturing the digital mirror device 200 according to the second embodiment in addition to the foregoing advantages (2) to (7).

(11) In the digital mirror device 200 according to the second embodiment, the rear surface has the thin portions of the rear surface thinned from the middle of the mirrors 302 to the end portions step by step (specifically, the end portions have the stepped shapes). Therefore, even when and the plurality of mirrors 302 operate in the same direction in the state in which the gap between the mutually adjacent mirrors 302 is narrow, the mutually adjacent mirrors 302 can be prevented from coming into contact with each other. Accordingly, it is possible to prevent the mirrors 302 from malfunctioning. It is possible to miniaturize the digital mirror device 200.

(12) In the method of manufacturing the digital mirror device 200 according to the second embodiment, the first mirror film 302a1 and the second mirror film 302a2 with different the etching rates are stacked and the etching process is performed on the regions which become the end portions of the mirrors 302. An etching amount of the first mirror film 302a1 with the larger etching rate in the lower layer can be configured to be greater than that of the second mirror film 302a2 in the upper layer. Accordingly, the thicknesses of the stepped shapes of the end portions of the rear surface (the side of the substrate 300) of the mirror 302 can be thinned than the thickness of the middle of the mirror 302. Further, it is possible to form the mirrors 302 with the stepped shapes using an existing apparatus.

The aspects of the invention are not limited to the foregoing embodiments, but can be appropriately modified within the scope of the invention without departing from the gist or idea of the invention readable from the claims and the entire specification and are included in the technical scope of the aspects of the invention. The aspects of the invention can be realized in the following forms.

MODIFICATION EXAMPLE 1

As described above, the aspects of the invention are not limited to the case in which the thin portions are formed in the four corners of the mirrors 102 or 302. For example, the thin portions may be formed only in portions coming into contact with the mirrors when the mirrors 102 or 302 operate. The aspects of the invention are not limited to the case in which the thin portions are formed in the four corners, but the thin portions may be formed in two corners facing each other.

MODIFICATION EXAMPLE 2

The aspects of the invention are not limited to the case in which the end portions are formed in the taper shapes using a photolithographic method and an etching method ad in the foregoing first embodiment. For example, the mirrors with the taper shapes may be formed in another substrate and the mirrors may be connected to the mirror support posts 105 using a transferring method. In the case of the transferring method, it is preferable to form the tapers in an easily formed order and perform transferring to the substrate 300 in opposite tapers.

MODIFICATION EXAMPLE 3

As described above, the end portions of the tapers may be in a straight state or a sharp state. It is preferable to the end portions have be straight from the viewpoint of strength.

MODIFICATION EXAMPLE 4

As described above, the aspects of the invention are not limited to the case in which the mirrors 102 are inclined in the directions of the edge portions. FIG. 13 is a schematic plan view illustrating the digital mirror device when viewed from the upper side. In FIG. 13, the electrodes 202 are formed on two sides facing each other in the mirror 102. The mirrors 102 are sloped in the directions of the two sides facing each other. In regions in which the thickness of the mirror 102 is thinned, as illustrated in FIG. 13, tapers may be formed in all of the four sides of the mirror 102 or tapers may be formed in only two facing sides in which the electrodes 202 are disposed.

Figure 14:
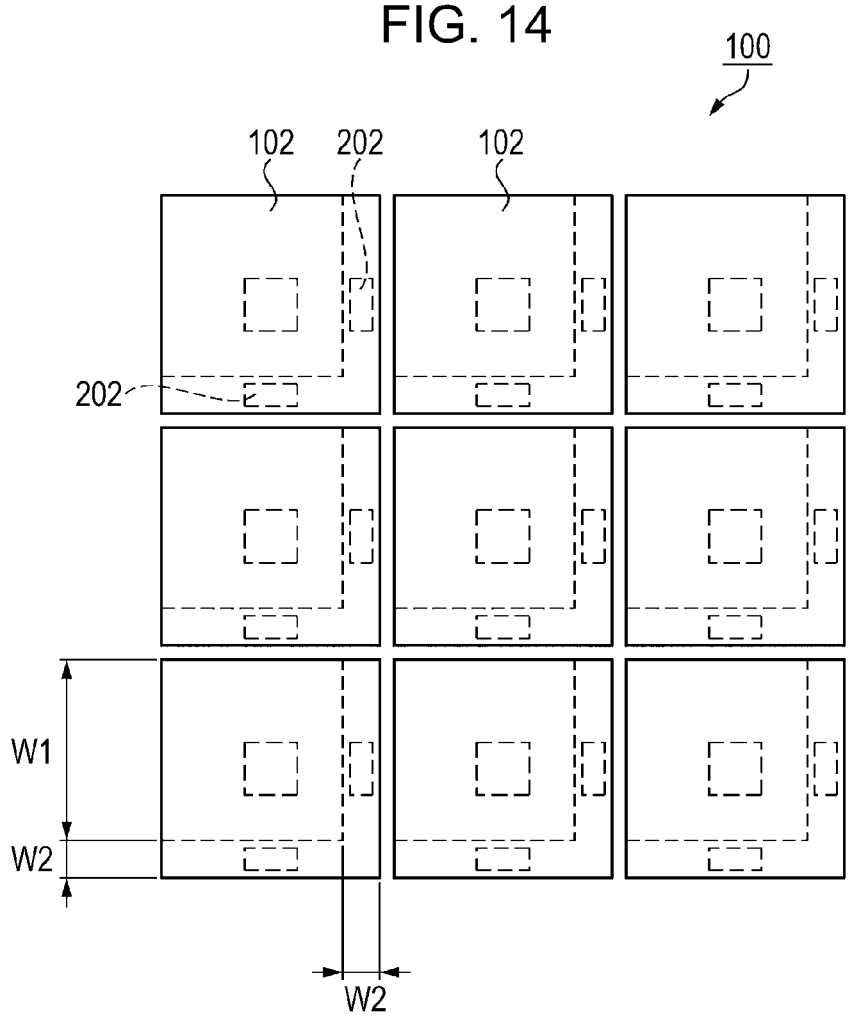
FIG. 14 is a schematic plan view illustrating the digital mirror device according to the modification example when viewed from the upper side.
Figure 15:
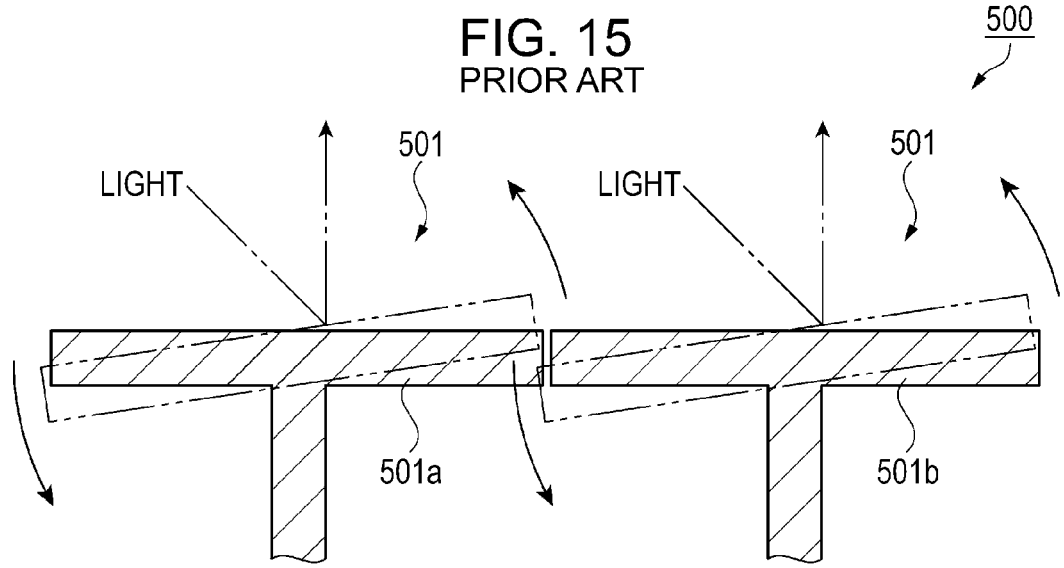
FIG. 15 is a schematic sectional view illustrating the configuration of a digital mirror device of the related art.

The mirror may have a configuration illustrated in FIG. 14. FIG. 14 is a schematic plan view illustrating the digital mirror device when viewed from the upper side. In FIG. 14, the electrodes 202 are formed on two sides in which the mirrors 102 are adjacent to each other. The mirrors 102 are sloped in the directions of two sides adjacent to each other. In regions in which the thickness of the mirror 102, as illustrated in FIG. 14, tapers are formed in at least sides in which the electrodes 202 are disposed.

MODIFICATION EXAMPLE 5

As described above, as the image display apparatus on which the digital mirror device 100 is mounted, not only various electronic apparatuses such as the projector 1000 but also a head-up display (HUD), a head-mounted display (HMD), a mobile mini projector, an on-vehicle apparatus, an audio apparatus, an exposure apparatus, and an illumination apparatus can be used.

What is claimed is:

1. A digital mirror device comprising:
    a substrate;
    a plurality of mirrors;
    a mirror support post that is disposed between the substrate and a mirror of the plurality of mirrors; and
    a first electrode that is disposed between the substrate and the mirror,
    wherein the mirror includes a first portion that is connected to the mirror support post, a second portion that is a portion overlapping with the first electrode, and a third portion that is a portion between the first and second portions, and
    wherein a thickness of the second portion of the mirror is thinner than a thickness of the third portion.

2. The digital mirror device according to claim 1, further comprising:
    a second electrode that is disposed between the substrate and the mirror,
    wherein the mirror includes a fourth portion that is a portion overlapping with the second electrode and a fifth portion that is a portion between the first and fourth portions, and
    wherein a thickness of the fourth portion of the mirror is thinner than a thickness of the fifth portion.

3. The digital mirror device according to claim 1, wherein the second portion of the mirror is a region of one side of the mirror.

4. The digital mirror device according to claim 3, wherein the fourth portion of the mirror is a region of the other side of the mirror, and
    wherein the second and fourth portions are symmetrically arranged to the mirror support post.

5. The digital mirror device according to claim 1, wherein the second portion of the mirror is disposed in an edge portion of the mirror.

6. The digital mirror device according to claim 5, wherein the fourth portion of the mirror is disposed in an edge portion of the mirror, and
    wherein the second and fourth portions are disposed in two edge portions located to be diagonal to each other.

7. The digital mirror device according to claim 1, wherein the second portion is formed in a taper shape gradually thinning from a middle of the mirror to an end portion of the mirror.

8. The digital mirror device according to claim 1, wherein the second portion is formed in a stepped shape at an end portion of the mirror.

9. A method of manufacturing a digital mirror device, comprising:
    forming a sacrificial layer on one surface side of a substrate;
    forming an opening hole in the sacrificial layer;
    forming a first mirror film above the sacrificial layer and in the opening hole, so as to form a mirror support post of a mirror;
    forming at least one portion in the first mirror film, in which an end portion of a region which becomes the mirror on the one surface side of the substrate, is thinner than a middle of the region; and forming the mirror by removing the sacrificial layer.

10. The method according to claim 9,
wherein the forming of the second portion includes
forming a resist pattern in the region which becomes the mirror in the first mirror film, and
performing an isotropic etching process on the first mirror film using the resist pattern as a mask.

11. The method according to claim 9,
wherein the forming of the second portion includes
forming a second mirror film with an etching rate less than the first mirror film above the first mirror film,
forming a resist pattern in a region which becomes the mirror above the second mirror film, and
performing an etching process on the first and second mirror films using the resist pattern as a mask.

12. A method of manufacturing a digital mirror device, comprising:
forming a sacrificial layer on one surface side of a substrate;
forming an opening hole in the sacrificial layer;
forming a mirror film in the opening hole, so as to form a mirror support post of a mirror;
forming a mirror in which at least one portion is formed so that a thickness of an end portion of the mirror on the one surface side of the substrate is thinner than a middle of the mirror; and
transferring the mirror to the sacrificial layer and above the opening hole to be connected to the mirror film of the opening hole.

13. An image display apparatus comprising:
the digital mirror device according to claim 1.

14. An image display apparatus comprising:
the digital mirror device according to claim 2.

15. An image display apparatus comprising:
the digital mirror device according to claim 3.

16. An image display apparatus comprising:
the digital mirror device according to claim 4.

17. An image display apparatus comprising:
the digital mirror device according to claim 5.

18. An image display apparatus comprising:
the digital mirror device according to claim 6.

19. An image display apparatus comprising:
the digital mirror device according to claim 7.

20. An image display apparatus comprising:
the digital mirror device according to claim 8.

\* \* \* \* \*